(12) United States Patent
Rolandi

(10) Patent No.: US 6,198,660 B1
(45) Date of Patent: Mar. 6, 2001

(54) SYNCHRONOUS MULTILEVEL NON-VOLATILE MEMORY AND RELATED READING METHOD

(75) Inventor: Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/572,127

(22) Filed: May 17, 2000

(30) Foreign Application Priority Data

May 31, 1999 (EP) .............................................. 998030331

(51) Int. Cl.$^7$ .................................................. G11C 16/04
(52) U.S. Cl. ................................ 365/185.11; 365/185.01; 365/230.03
(58) Field of Search .................... 365/185.11, 185.01, 365/230.03

(56) References Cited

U.S. PATENT DOCUMENTS

| | | | |
|---|---|---|---|
| 5,297,148 | * 3/1994 | Harrari et al. ....................... | 371/10.2 |
| 5,375,097 | * 12/1994 | Reddy et al. ......................... | 365/190 |
| 5,497,354 | 3/1996 | Sweha et al. ................... | 364/230.06 |
| 5,691,956 | 11/1997 | Chang et al. ......................... | 365/239 |

FOREIGN PATENT DOCUMENTS

0913834A1  7/1996 (EP) .......................................... 16/6

* cited by examiner

*Primary Examiner*—Vu A. Le
(74) *Attorney, Agent, or Firm*—Theodore E. Galanthay; Allen, Dyer, Doppelt, Milbrath & Gilchrist, P.A.

(57) ABSTRACT

The memory and method for reading include a synchronous multilevel non-volatile memory with cell addresses which define a pair of memory cells on different planes of the multilevel memory and plane addresses which define the plane on which the memory cell defined by a memory cell address is to be read. The memory and method include switching the plane address at a preset time interval after the switching of a memory address and at the highest possible switching frequency, and reading the content of a memory location, from the memory, which corresponds to the memory address on planes alternatively indicated by the switching of the plane address.

20 Claims, 3 Drawing Sheets

SYNCHRONOUS MULTILEVEL NON-VOLATILE MEMORY AND RELATED READING METHOD

FIELD OF THE INVENTION

The present invention relates to static memories, and, more particularly, to synchronous multilevel non-volatile memories and associated methods.

BACKGROUND OF THE INVENTION

It is known that the most recent developments in the field of computers have produced microprocessors which operate at ever higher clock frequencies. These processors must of course be interfaced with non-volatile memories, such as EPROM and FLASH memories. However, the increase in the clock frequency of processors has not been accompanied by a correlated increase in the operating frequency of non-volatile memories, which currently operate at much lower frequencies, at most 20 MHz.

Accordingly, the performance of processors on the motherboard of computers which must interface with the non-volatile memories via a bus depends on the operating frequency of the non-volatile memories and therefore such performance is decreased. Likewise, hard disk drives contain non-volatile memories which, as mentioned, have an operating speed which also decreases performance of the hard disk drives.

Accordingly, the trend is to obtain improved performance from memories via particular architectural 5 techniques which have the drawback that they require additional silicon areas which increases the costs of the system. Currently, a good technique is the so-called burst method, which however requires an additional silicon area, leading to a cost increase.

SUMMARY OF THE INVENTION

An object of the present invention is to provide a synchronous multilevel non-volatile memory in which the operating speed of the memory is substantially doubled with respect to known non-volatile memories. Another object of the present invention is to provide a synchronous multilevel non-volatile memory in which the increase in the performance of the memory is not accompanied by an increase in occupied silicon area.

Another object of the present invention is to provide a synchronous multilevel non-volatile memory in which the storage capacity is the same, in contrast with a higher operating speed and with a silicon area occupation similar to that of conventional memory devices. Another object of the present invention is to provide a method for reading a synchronous multilevel non-volatile memory which allows an increase in the reading performance of the memory. Another object of the present invention is to provide a synchronous multilevel non-volatile memory which is highly reliable, relatively easy to manufacture and at competitive costs.

These objects and others which will become apparent hereinafter are achieved by a method for reading a synchronous multilevel non-volatile memory with cell addresses which define a pair of memory cells on different planes of the multilevel memory and plane addresses which define the plane on which the memory cell defined by a memory cell address is to be read. The method includes switching the plane address at a preset time interval after the switching of a memory address and at the highest possible switching frequency, and reading the content of a memory location, from the memory, which corresponds to the memory address on planes alternatively indicated by the switching of the plane address.

BRIEF DESCRIPTION OF THE DRAWINGS

Further characteristics and advantages of the invention will become apparent from the description of a preferred embodiment of a non-volatile memory according to the invention, illustrated only by way of non-limitative example in the accompanying drawings, wherein.

DETAILED DESCRIPTION OF THE PREFERRED EMBODIMENT

Figure 1:
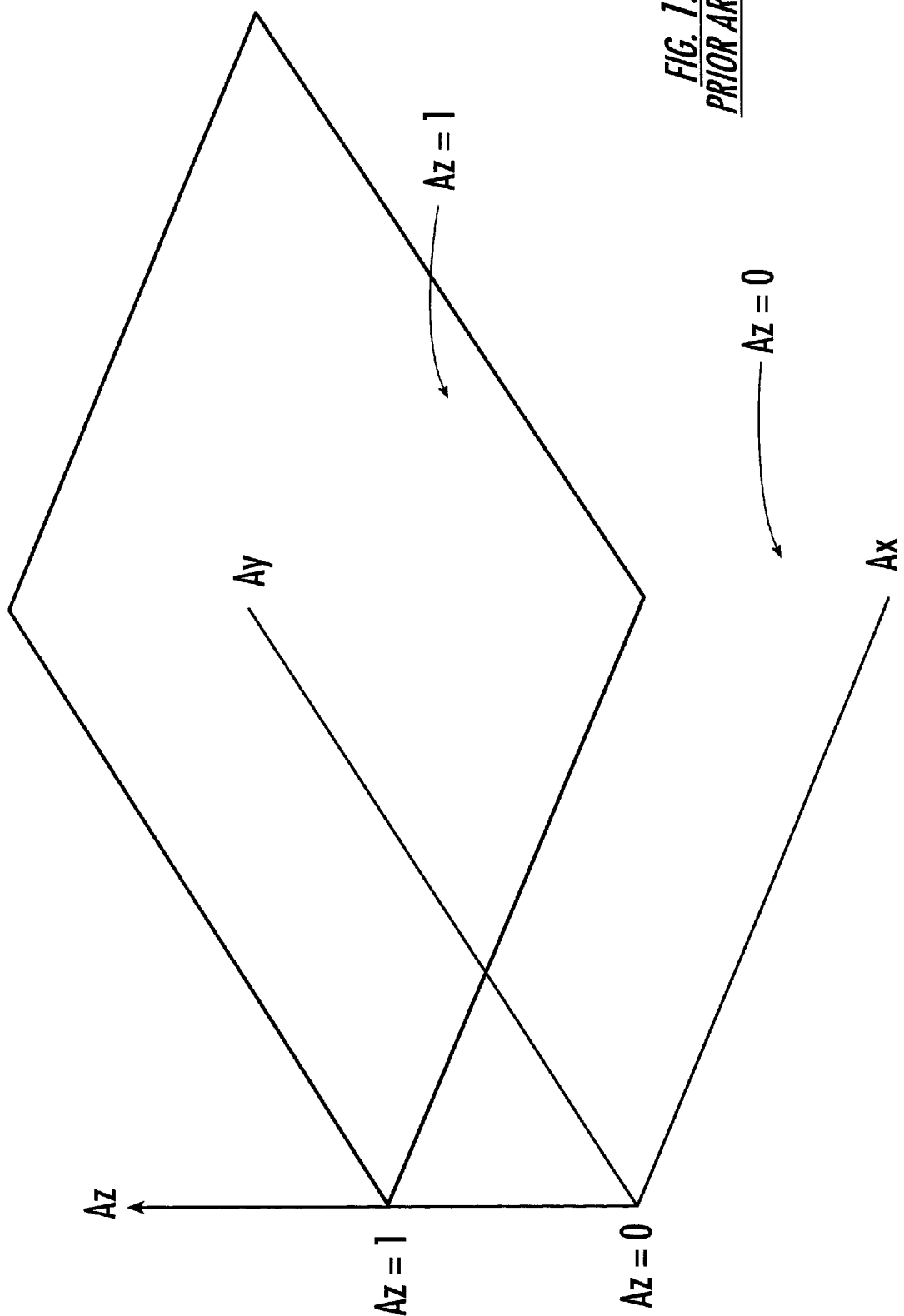
FIG. 1 is a view of the architecture of a known multilevel memory.

Known multilevel memories currently in use include arrays of programmable cells with four distinct current levels. Accordingly, two bits are associated with each memory location. The array can be represented schematically as shown in FIG. 1, which shows the arrangement on two planes, where the locations of each plane are identified by the addresses {Ax, Ay} while the planes are selected via the address Az. Simultaneous selection of two locations belonging to different planes with identical addresses {Ax, Ay} is known to those skilled in the art.

Figure 2:
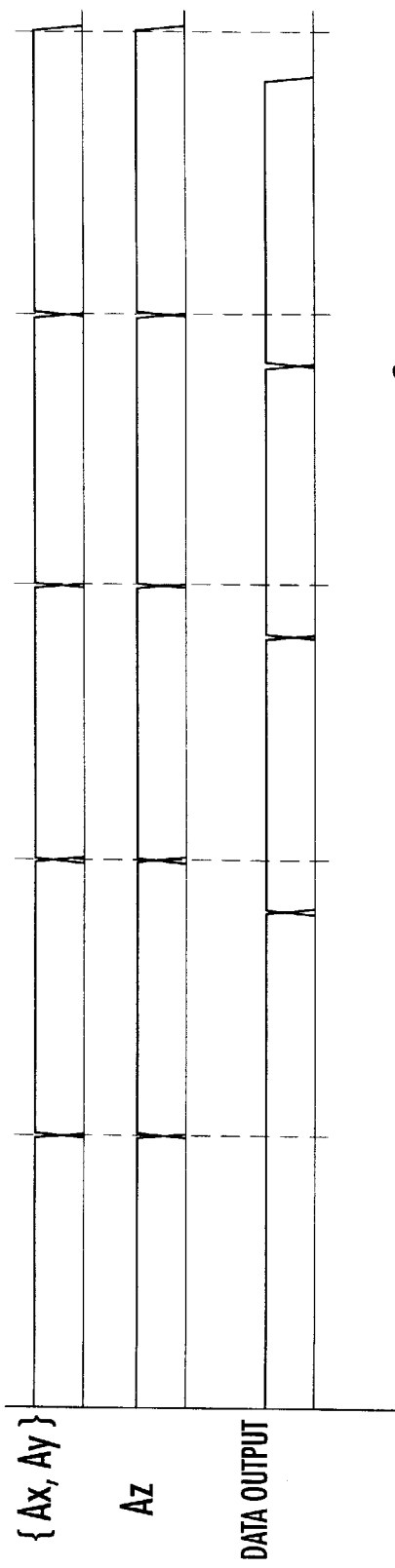
FIG. 2 is a read timing chart of a known multilevel memory.

FIG. 2 plots the read timing of a multilevel memory shown in FIG. 1. The chart shows that at the address transition {Ax, Ay} the transition of the address Az occurs and is followed by the output of the data, designated by "data output", which is delayed with respect to the address transitions. Consider now a series of addresses {Ax, Ay, Az} which switch continuously. Every time a variation in the addresses {Ax, Ay} occurs, a memory cell read occurs and, as explained earlier, is associated with two locations which belong to two separate planes. Reading a cell is known to artisans as "sensing" and is the slowest part of the access to a non-volatile memory.

The possibility of associating two binary values with a cell therefore provides considerable savings in terms of electrical performance. The address Az instead is meant to select the plane whose content is to be read and is inherently fast.

Thus, in accordance with the present invention, the address Az switches at the highest possible frequency and decides which plane of the multilevel memory is to be accessible at the outputs, while the addresses {Ax, Ay} switch for a preset time interval before the falling (rising) front of the address Az (and therefore at half the frequency), for activating the actual reading of the memory cell. This preset time is preferably at least 5 ns before the falling (rising) front of the address Az.

Figure 3:
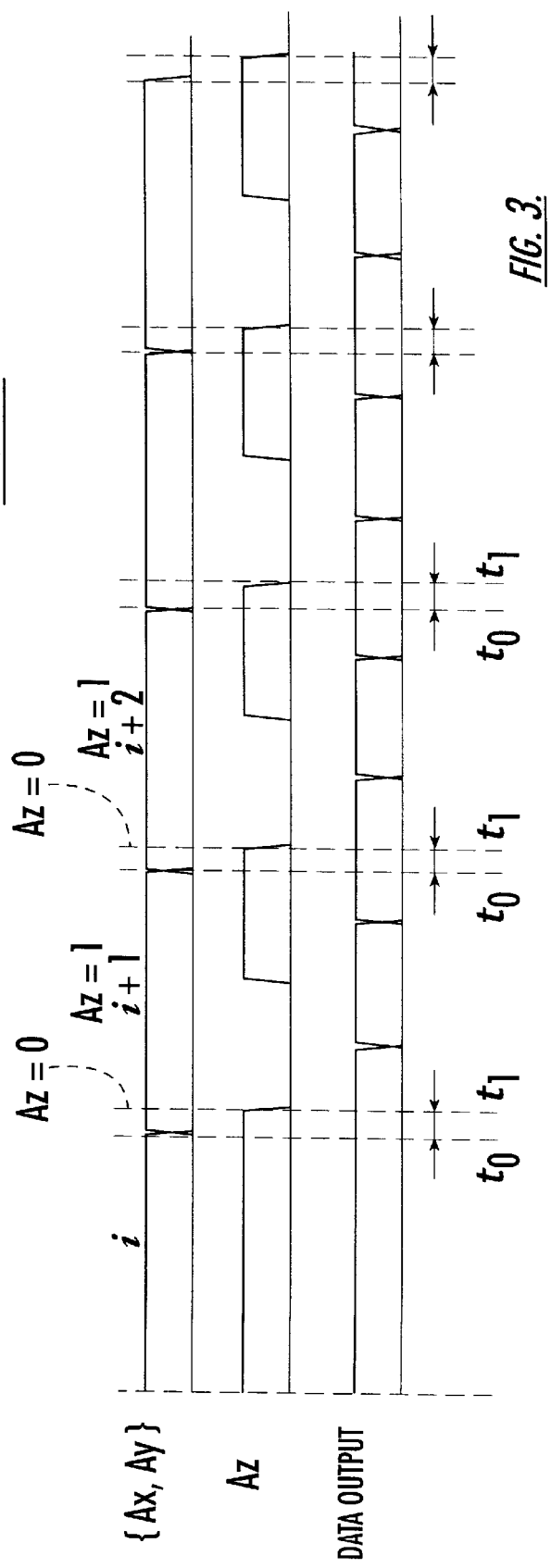
FIG. 3 is a read timing chart of the synchronous multilevel non-volatile memory according to the present invention.

Assume, therefore, that one begins from a generic address {Ax, Ay}. Reading of the i-th cell is activated by the change of these addresses. The address Az remains stable until the second switching of the addresses {Ax, Ay} occurs. With reference now to FIG. 3, the chart of the read timings of the non-volatile memory according to the invention is illustrated. The first reading of the cell i is of the conventional type, while the subsequent reads benefit from an operating speed which is substantially doubled with respect to known memory cells.

As shown in FIG. 3, the transition of the addresses {Ax, Ay} occurs at the time t0 for the first read, and at that time the address Az does not change state. This occurs a preset time t1 later, and the difference between t1 and t0 is, as mentioned, preferably at least 5 ns. Therefore, the appropriately provided circuits are allowed to perform, in the established times, the reading of the multilevel cell that corresponds to the i-th address. At least 5 ns after the second switching of the addresses {Ax, Ay}, switching of the address Az occurs, making the location of a memory plane available to the output devices.

The subsequent switching front of the address Az makes the corresponding location of the other plane available at the output. The second switching of the addresses {Ax, Ay} instead activates the reading of the i+1-th cell, which is completed on the second falling (rising) front of the address Az. The above-described cycle can be iterated until complete reading of the non-volatile memory is achieved. The reading accordingly occurs at the clock frequency of the address Az, except for an initial reading which is performed at the conventional rate. As shown in FIG. 3, data output occurs at twice the frequency obtainable with known memories, the timings of which are shown in FIG. 2. It is also possible to access the memory with the conventional random mode if one wishes not to use the burst mode.

Figure 4:
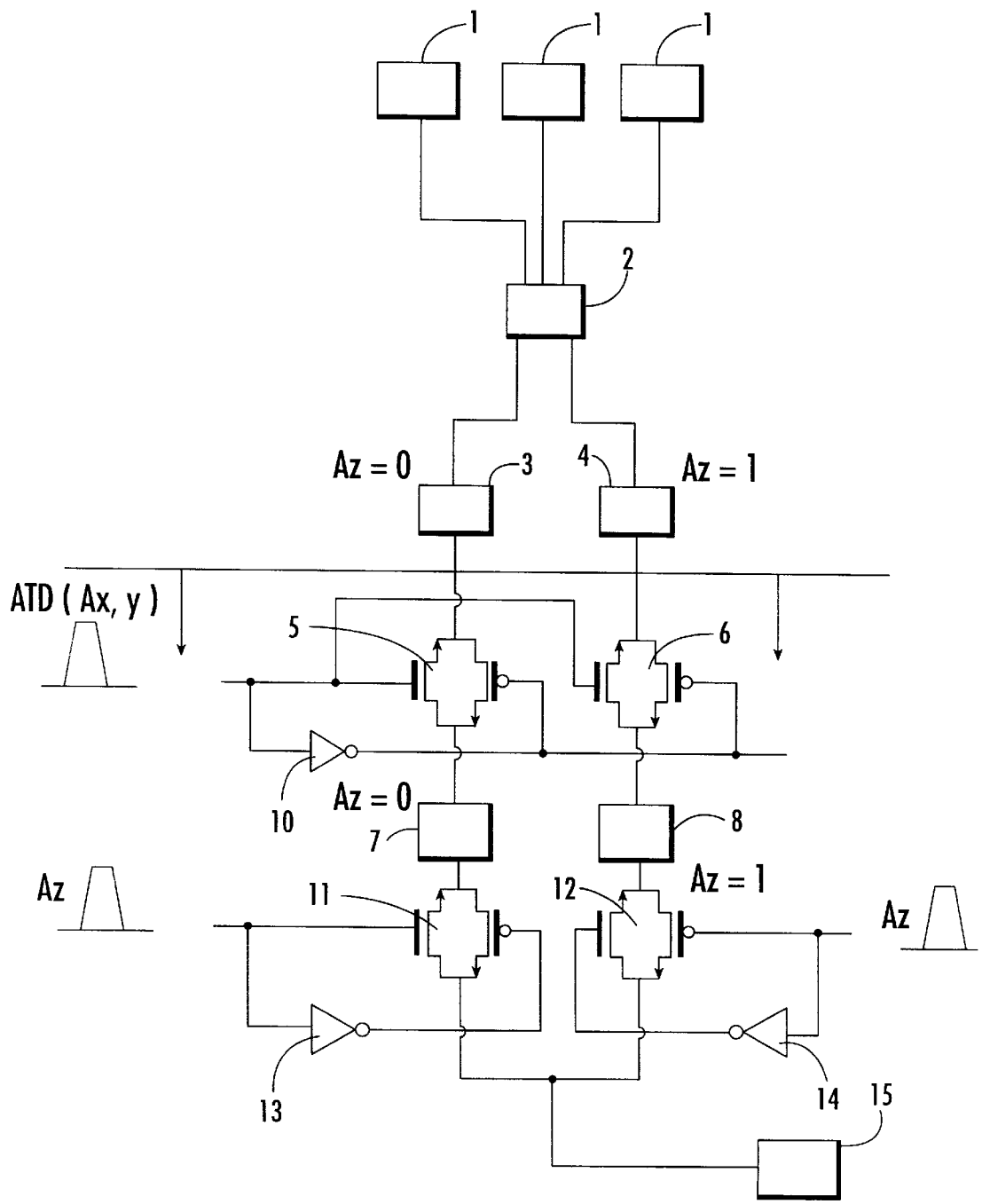
FIG. 4 is a block diagram which exemplifies a circuit embodiment of the synchronous multilevel non-volatile memory according to the present invention.

FIG. 4 is a view of a possible circuit embodiment for implementing the above-described method for reading a synchronous multilevel non-volatile memory. In the figure, the sense amplifiers 1 for detecting the data item of the memory cell, are connected to logic means/circuit 2 which reads the i-th cell which contains n information bits (for example 2 bits). The logic means 2 are connected to a pair of registers 3 and 4, which respectively store the information related to a given location on the plane z=0 and the information related to the same location but on the plane z=1.

An aspect of the synchronous multilevel non-volatile memory according to the invention is that it has, upstream of the output devices (buffers), a circuit with additional registers which stores, during address changing from cell i to cell i+1, the content of the two registers 3 and 4 so that it can then be transmitted to the output devices. Therefore, in particular, the register 3 is connected to a pass transistor 5, while the register 4 is connected to a pass transistor 6. The transistors are in turn connected to additional registers 7 and 8 respectively.

The pass transistor 5 and the pass transistor 6, formed respectively by two N-type and P-type transistors, respectively receive as inputs at the gate terminals of the N-type transistors, the signal ATD {Ax, Ay} which indicates the address change from memory cell i to memory cell i+1. The P-type transistors of the pass transistors 5 and 6 instead receive the inverted signal ATD {Ax, Ay}, obtained by passing through a first inverter 10. Downstream of the registers 7 and 8 there are provided additional pass transistors 11 and 12 respectively.

The pass transistor 11, arranged at the side of the circuit in which the information related to the location arranged on the plane z=0 is stored, receives as an input to the gate terminal of the N-type transistor, the signal indicating the variation of the falling front of the address Az and receives, at the gate terminal of the P-type transistor, the same signal inverted after passing through a second inverter 13. Likewise, the pass transistor 12 receives as an input to the gate terminal of the P-type transistor, the signal that indicates the rising front of the address Az and receives, at the gate terminal of the N-type transistor, the same signal, inverted after passing through a third inverter 14. In this manner, an information item related to the memory location arranged on the plane z=0 is read first, then the information related to the memory location arranged on the plane z=1 is read. The output of the two pass transistors 11 and 12 is connected to the output devices, schematically designated by the reference numeral 15.

In practice it has been observed that the synchronous multilevel non-volatile memory according to the invention and the corresponding reading method allow to using a non-volatile multilevel memory in the burst mode, which is the fastest mode currently obtainable from the device, with considerable advantages from the point of view of occupied silicon area. The non-volatile memory and the related reading method of the present invention are susceptible to numerous modifications and variations, all of which are within the scope of the inventive concept. Of course, all the details may also be replaced with other technically equivalent elements.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

That which is claimed is:

1. A method for reading a synchronous multilevel non-volatile memory with cell addresses which define a pair of memory cells on different planes of the multilevel memory and plane addresses which define the planes on which the memory cells defined by cell addresses are to be read, the method comprising:

switching a plane address at a preset time interval after switching of a cell address and at a highest possible switching frequency; and reading the content at a memory location, from the memory, which corresponds to the cell address on planes alternatively indicated by the switching of the plane address.

2. A method according to claim 1, wherein the plane address does not switch until after a preset time interval following a first reading of a memory cell, defined by the cell address, and wherein switching of the plane address occurs at a preset time after a second switching of cell address.

3. A method according to claim 1, wherein the reading is performed after each switching of the plane address.

4. A method according to claim 1, wherein the preset time interval produces switching of the plane address at twice the frequency of the cell address.

5. A method for reading a synchronous multilevel non-volatile memory with cell addresses which define a pair of memory cells on different planes of the multilevel memory and plane addresses which define planes on which memory cells defined by cell addresses are to be read, the method comprising:

switching a cell address;

switching a plane address at a preset time after the switching of the cell address and at a predetermined switching frequency; and reading a memory cell which corresponds to the cell address on planes alternatively indicated by the switching of the plane address.

6. A method according to claim 5, wherein the plane address does not switch until after a preset time following a first reading of a memory cell, defined by the cell address, and wherein switching of the plane address occurs at a preset time after a second switching of the cell address.

7. A method according to claim 5, wherein the reading is performed after each switching of the plane address.

8. A method according to claim 5, wherein the switching of the plane address occurs at twice the frequency of the cell address.

9. A synchronous multilevel non-volatile memory comprising:
    a plurality of memory cells on a plurality of planes;
    a logic device for reading the memory cells;
    a plurality of sense amplifiers connected to the logic device;
    first registers connected to the logic device and for storing content of memory cells having a same cell address and a different plane address; and
    second registers which are driven by a switching of the cell address to store content of the first registers at a switching of the cell address from one memory cell to a subsequent memory cell, and for outputting content following a switching of the plane address, to alternatively read the content of memory cells having the same cell address but a different plane address.

10. A non-volatile memory according to claim 9, further comprising a loading circuit for loading the content of the first registers into the second registers, the loading circuit being interposed between the first and second registers and being driven by the switching of the cell address.

11. A non-volatile memory according to claim 10, wherein the loading circuit comprises pass transistors.

12. A non-volatile memory according to claim 9, further comprising:
    an output device; and
    an additional output circuit, for outputting the contents of memory cells having the same cell address and a different plane address, being interposed between the second registers and the output device, and being driven by the switching of the plane address to sequentially output the contents of the memory cells having the same memory address and a different plane address.

13. A non-volatile memory according to claim 12, wherein the additional output circuit comprises pass transistors.

14. A synchronous multilevel non-volatile memory comprising:
    a plurality of memory cells on a plurality of planes, cell addresses defining a pair of memory cells on different planes, and plane addresses defining planes on which the memory cells defined by cell addresses are to be read;
    a reading circuit for reading the memory cells;
    first registers connected to the reading circuit and for storing content of memory cells having a same cell address and a different plane address; and
    second registers for storing content of the first registers at a switching of the cell address from one memory cell to a subsequent memory cell, and for outputting content following a switching of the plane address, to alternatively read the content of memory cells having the same cell address but a different plane address.

15. A non-volatile memory according to claim 14, further comprising a loading circuit for loading the content of the first registers into the second registers, the loading circuit being connected between the first and second registers and being driven by the switching of the cell address.

16. A non-volatile memory according to claim 15, wherein the loading circuit comprises pass transistors.

17. A non-volatile memory according to claim 14, further comprising:
    an output device; and
    an additional output circuit, for outputting the contents of memory cells having the same cell address and a different plane address, being connected between the second registers and the output device, and being driven by the switching of the plane address to sequentially output the contents of the memory cells having the same memory address and a different plane address.

18. A non-volatile memory according to claim 17, wherein the additional output circuit comprises pass transistors.

19. A synchronous multilevel non-volatile memory with cell addresses which define a pair of memory cells on different planes of the multilevel memory and plane addresses which define planes on which memory cells defined by cell addresses are to be read, the memory comprising:
    means for switching a cell address;
    means for switching a plane address at a preset time after the switching of the cell address and at a highest possible switching frequency; and
    means for reading a memory cell which corresponds to the cell address on planes alternatively indicated by the switching of the plane address.

20. A memory according to claim 19, wherein the plane address does not switch until after a preset time following a first reading of a memory cell, defined by the cell address, and wherein switching of the plane address occurs at a preset time after a second switching of the cell address.

* * * * *